United States Patent [19]
Mattos et al.

[11] Patent Number: 5,543,733
[45] Date of Patent: Aug. 6, 1996

[54] HIGH VOLTAGE TOLERANT CMOS INPUT/OUTPUT CIRCUIT

[75] Inventors: Derwin W. Mattos, San Jose; Ralph P. Heron, Morgan Hill; Donald Lee, San Jose, all of Calif.

[73] Assignee: VLSI Technology, Inc., San Jose, Calif.

[21] Appl. No.: 494,756

[22] Filed: Jun. 26, 1995

[51] Int. Cl.$^6$ .................. H03K 19/0175; H03K 19/094
[52] U.S. Cl. .............................................. 326/81; 326/68
[58] Field of Search ................... 326/81, 68, 71; 327/534, 537

[56] References Cited

U.S. PATENT DOCUMENTS

| | | | |
|---|---|---|---|
| 5,017,811 | 5/1991 | Worley | 326/81 |
| 5,442,307 | 8/1995 | Shigehara et al. | 326/81 |
| 5,448,198 | 9/1995 | Toyoshima et al. | 326/81 |
| 5,450,025 | 9/1995 | Shay | 326/81 |
| 5,451,889 | 9/1995 | Hiem et al. | 326/81 |

*Primary Examiner*—Edward Westin
*Assistant Examiner*—Richard Roseen
*Attorney, Agent, or Firm*—Flehr, Hohbach, Test, Albritton & Herbert

[57] ABSTRACT

An input/output circuit communicates an external input signal to an internal signal and converts an internal signal to an external output signal. In one embodiment, the input/output circuit has a power supply terminal, and an input terminal that is coupled to an output terminal via a conductor. A pull-up circuit is coupled to the power supply terminal and the conductor, and includes a PMOS transistor having an N-well, where the pull-up circuit is configured to selectively pull-up the output signal. A pull-down circuit is coupled to a ground terminal and the conductor, and is configured to selectively pull-down the output signal. A comparison and logic control circuit is coupled to the power supply terminal and to the conductor, and is configured to compare a supply voltage level to the input signal and is configured to generate an affirmative logic signal when the input signal is greater than the supply voltage level and to generate a negative logic signal when the input signal is less than the supply voltage level. An N-well control circuit is coupled to the power supply terminal, to the conductor and to the pull-up circuit, where the N-well control circuit is responsive to the logic signal, and is configured to output a control N-well signal to control the PMOS transistor N-well voltage.

6 Claims, 7 Drawing Sheets

5,543,733

HIGH VOLTAGE TOLERANT CMOS INPUT/OUTPUT CIRCUIT

FIELD OF THE INVENTION

The present invention relates generally to a low voltage internal input/output circuit configured to tolerate communication with a high voltage external circuit. In particular, it relates to an input/output circuit that efficiently communicates a low voltage output signal to an external terminal and efficiently communicates a high voltage input signal to a low voltage internal terminal.

BACKGROUND OF THE INVENTION

Low voltage integrated circuits are popular for reasons including low power dissipation, which makes them ideal for use as processors in hand-held and portable commercial electronic products. However, higher voltage integrated circuits continue to be required to perform various functions such as communicating with user interfaces. For example, a low voltage integrated circuit processor may operate at 3 V, while a high voltage integrated circuit interface device may operate at 5 V. Therefore, to construct a commercial product, a combination of 3 V circuits and 5 V circuits are required, where the circuits must be capable of communicating with one another. Circuitry for handling this communication is the subject of the present invention.

FIG. 1 shows a conventional input/output circuit according to the prior art. The circuit is externally supplied with an internal operating voltage (VDD). An external terminal 2 is coupled to an internal terminal 4 via a conductor 5. A pull-up circuit 6 is coupled to VDD and conductor 5. In output mode, output enable (oen) is low and output enable inverse (oenb) is high. The internal signal triggers either pull-up circuit 6 or pull-down circuit 10 to drive the desired output signal to external terminal 2. Although an external circuit coupled to terminal 2 may be operating at a higher voltage than the FIG. 1 circuit, generally an output logic 1 translates to the external circuit as a logic 1 and an output logic 0 translates to the external circuit as a logic 0. For example, a 3 V output is interpreted by a 5 V external circuit as a logic 1 because 3 V is above the logic threshold of approximately 2.5 V, and a 0 V output is interpreted by a 5 V external circuit as a logic 0 because both circuits use 0 as a logic 0.

In input mode, oen is high and oenb is low thereby disabling pull-up circuit 6 and pull-down circuit 10. However, when an external input signal on terminal 2 exceeds the circuit's internal operating voltage (VDD), current flows through a diode 8 in pull-up circuit 6. While, diode 8 limits the input voltage to approximately VDD $+V_{TH}$(diode), the current flowing through diode 8 may cause excess energy dissipation and may also adversely affect the integrity of the input signal. An example of a voltage difference that would trigger this harmful condition is when the external input signal is 5 V and the internal operating voltage is 3 V. As a result of this condition, the conventional circuit of FIG. 1 cannot be used by a low voltage integrated circuit to receive a high voltage input signal.

The combined use of low voltage circuits and high voltage circuits creates a motivation to design an input/output circuit that efficiently communicates a low voltage output signal to a high voltage external circuit and efficiently communicates a high voltage input signal to a low voltage internal circuit.

SUMMARY OF THE INVENTION

The present invention relates generally to a low voltage internal input/output circuit configured to tolerate communication with a high voltage external circuit. In particular, it relates to an input/output circuit that efficiently communicates a low voltage output signal to an external terminal and efficiently communicates a high voltage input signal to a low voltage internal terminal.

An input/output circuit communicates an external input signal to an internal signal and converts an internal signal to an external output signal. In one embodiment, the input/output circuit has a power supply terminal, and an input terminal that is coupled to an output terminal via a conductor. A pull-up circuit is coupled to the power supply terminal and the conductor, and includes a PMOS transistor having an N-well, where the pull-up circuit is configured to selectively pull-up the output signal. A pull-down circuit is coupled to a ground terminal and the conductor, and is configured to selectively pull-down the output signal. A comparison and logic control circuit is coupled to the power supply terminal and to the conductor, and is configured to compare a supply voltage level to the input signal and is configured to generate an affirmative logic signal when the input signal is greater than the supply voltage level and to generate a negative logic signal when the input signal is less than the supply voltage level. An N-well control circuit is coupled to the power supply terminal, to the conductor and to the pull-up circuit, where the N-well control circuit is responsive to the logic signal, and is configured to output a control N-well signal to control the PMOS transistor N-well voltage.

Advantages of the invention include improved input and output signal control and reduced power dissipation. Another advantage of the invention is that it prevents the N-well voltage from floating below VDD when the input signal's voltage is equal to VDD, which increases the circuit's latch-up immunity.

BRIEF DESCRIPTION OF THE DRAWINGS

Additional objects and features of the invention will be more readily apparent from the following detailed description and appended claims when taken in conjunction with the drawings, in which:

DETAILED DESCRIPTION

The present invention relates generally to a low voltage internal input/output circuit configured to tolerate communication with a high voltage external circuit. In particular, it relates to an input/output circuit that efficiently communicates a low voltage output signal to an external terminal and efficiently communicates a high voltage input signal to a low voltage internal terminal.

The exemplary embodiments are described herein with reference to specific configurations. Those skilled in the art will appreciate that various changes and modifications can be made to the exemplary embodiments while remaining within the scope of the present invention. For example, additional circuitry might be added to accomplish additional functions, or equivalent circuits might be used to replace some or all of the circuitry used in the preferred embodiments.

Figure 1:
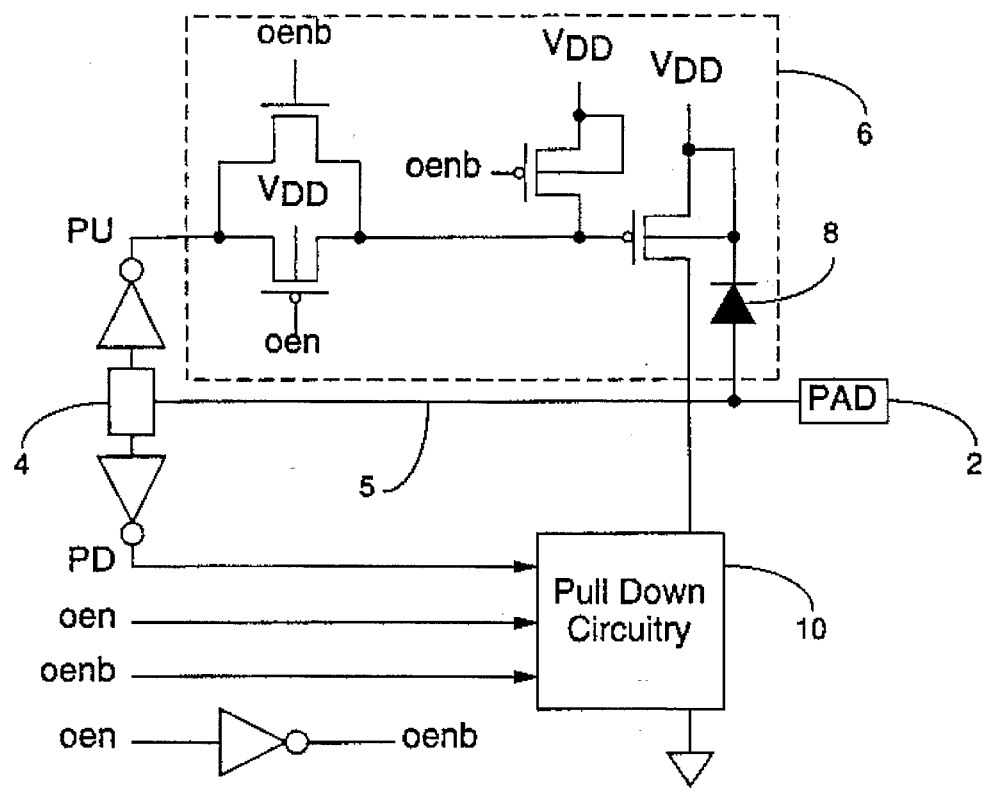
FIG. 1 depicts a conversion circuit according to the prior art.
Figure 2:
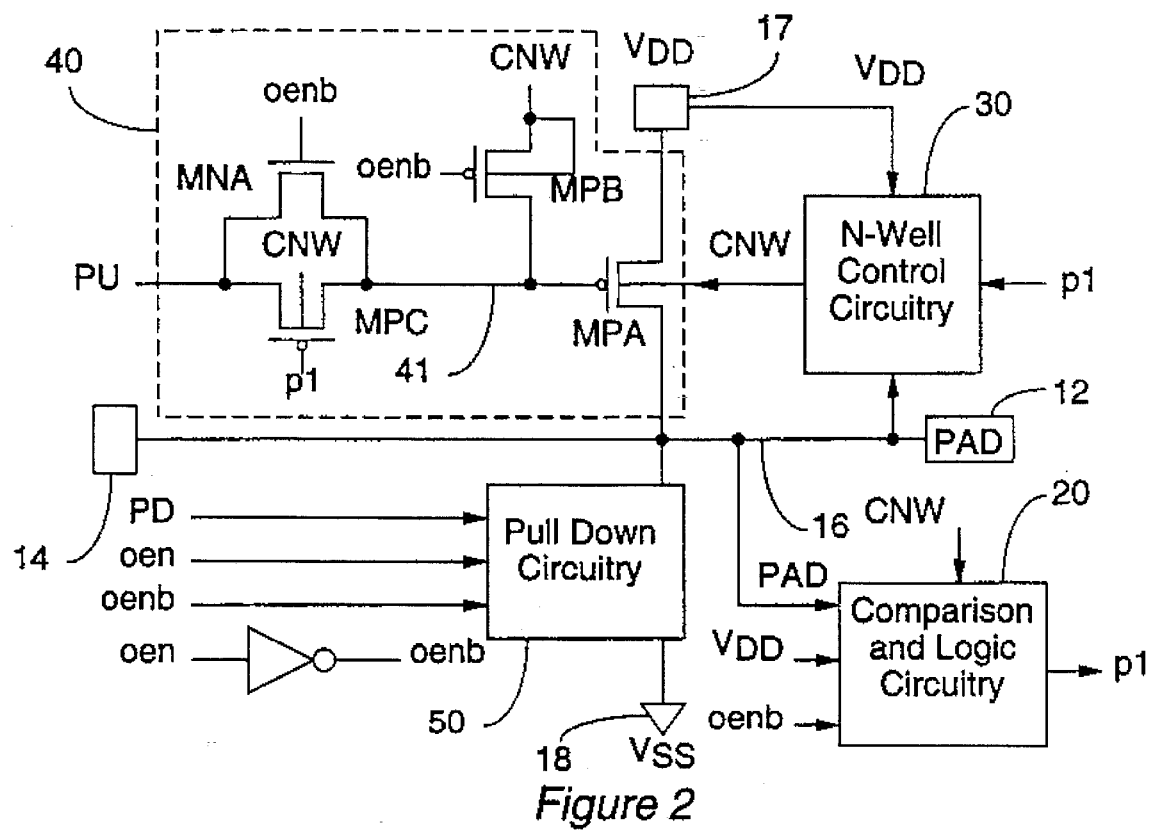
FIG. 2 depicts a conversion circuit according to one embodiment of the invention.

An exemplary embodiment of the invention is described with reference to FIGS. 2 through 8. FIG. 2 depicts an input/output circuit according to one embodiment of the invention. An external terminal 12 is provided to communicate with external circuitry. An internal terminal 14 is provided to communicate with internal circuitry, and is coupled to external terminal 12 via conductor 16. A power supply terminal 17 is provided and a ground terminal 18 is also provided. Output enable signal (oen) and output enable inverse signal (oenb) are generated by internal logic circuitry (not shown) and control the operation of comparison and logic circuit 20, N-well control circuit 30, pull-up circuit 40 and pull-down circuit 50, as explained below.

Output Mode

Figure 3:
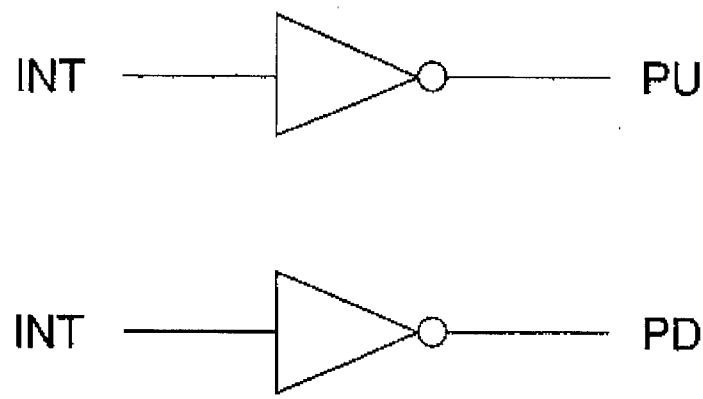
FIG. 3 depicts a circuit showing a relationship between an input signal and PU and PD.

The input/output circuit is first explained with reference to a low voltage internal signal driving internal terminal 12. FIG. 3 shows the relationship between internal output signal INT and PU and PD. As shown, signals PU and PD are the inverse of signal INT. In this output case, the

| output enable (active low) | oen | low |
| output enable inverse | oenb | high |
| control N-well | CNW | VDD |
| P1 control signal | P1 | low |

Oenb is high, thereby disabling MPB. Comparison and logic circuit 20, explained below with reference to FIG. 5, sets P1 low. N-well control circuit 30, explained below with reference to FIG. 7, sets CNW to VDD. Since oenb is high and P1 is low, transistors MNA and MPC are both on. Therefore, PU controls transistor MPA's operation. When INT is high, PU is low and MPA is on thereby setting external terminal 12 high. When INT is low, PU is high and MPA is off allowing pull-down circuit 50 to control external terminal 12.

Figure 4:
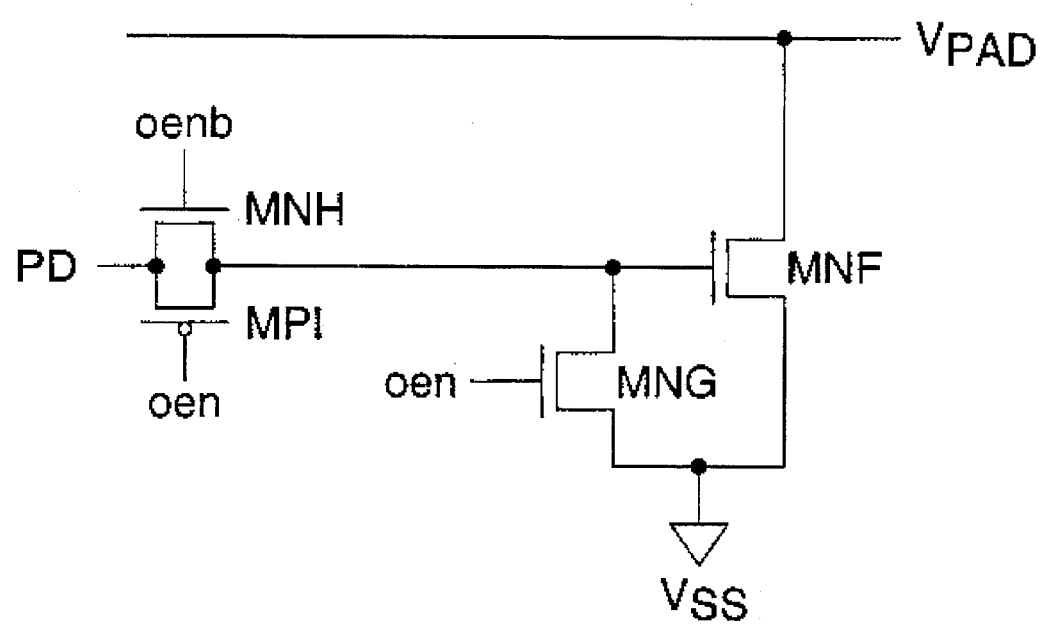
FIG. 4 depicts a pull-down circuit according to one embodiment of the invention.

Pull down circuit 50 is shown in FIG. 4, having a similar configuration to pull-up circuit 40. Oen is low thereby disabling MNG. Since oenb is high and oen is low, transistors MNH and MNI are both on. As a result, PD controls transistor MNF's operation. When INT is low, PD is high and MNF is on thereby setting external terminal 12 low. When INT is high, PD is low and MNF is off allowing pull-up circuit 40 to control external terminal 12.

Input Mode

The input/output circuit is next explained with reference to a high voltage external input signal driving external terminal 12. In this input case, the following parameters are set:

| output enable (active low) | oen | high |
| output enable inverse | oenb | low |
| control N-well | CNW | greater of VPAD and VDD |
| P1 control signal | P1 | high if VPAD > VDD |
| | | low if VPAD ≦ VDD |

Figure 5:
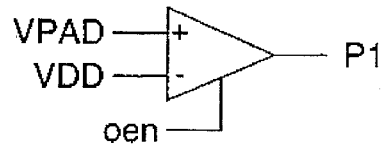
FIG. 5 depicts a comparison and logic circuit according to one embodiment of the invention.

To achieve these desired parameters, comparison and logic circuit 20 performs a special task and is described with reference to FIG. 5. A comparator 22 is set active by oen high. Comparator 22 receives both an external terminal signal (VPAD) and an internal supply voltage signal VDD. When VPAD is greater than VDD, comparator 22 sets P1 to VPAD. When VPAD is equal to or less than VDD, comparator 22 sets P1 to approximately the same voltage as VPAD.

Figure 6A:
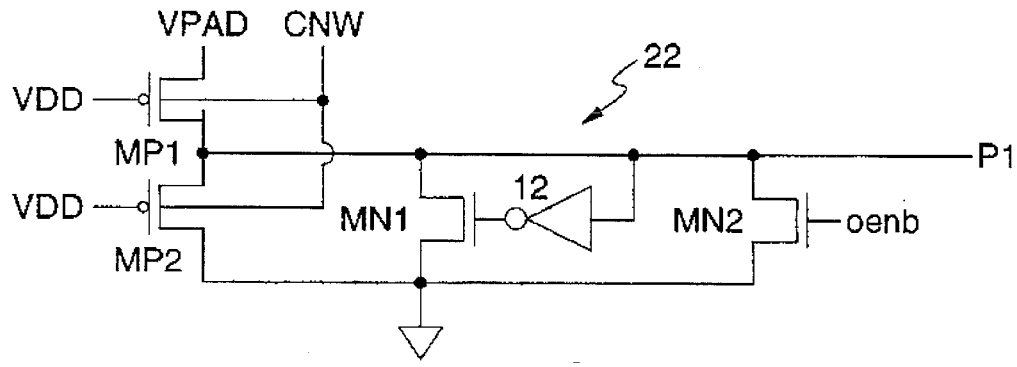
FIGS. 6A and 6B depict a comparison and logic circuit according to other embodiments of the invention.

A circuit that performs this function is shown in FIG. 6A. When VPAD is greater than VDD, MP1 is on and P1 is set to VPAD. When VPAD is less than VDD, MP1 is off and MP2 is on as long as P1 is higher than VPAD, thereby setting P1 to approximately the same voltage as VPAD. Additionally, MN1 pulls P1 low when inverter 12 senses that P1 has been pulled down past inverter 12's input threshold of approximately VDD/2. Transistor MN2 is used to insure that P1 is set low when the converter circuit is in output mode (described above).

Figure 6B:
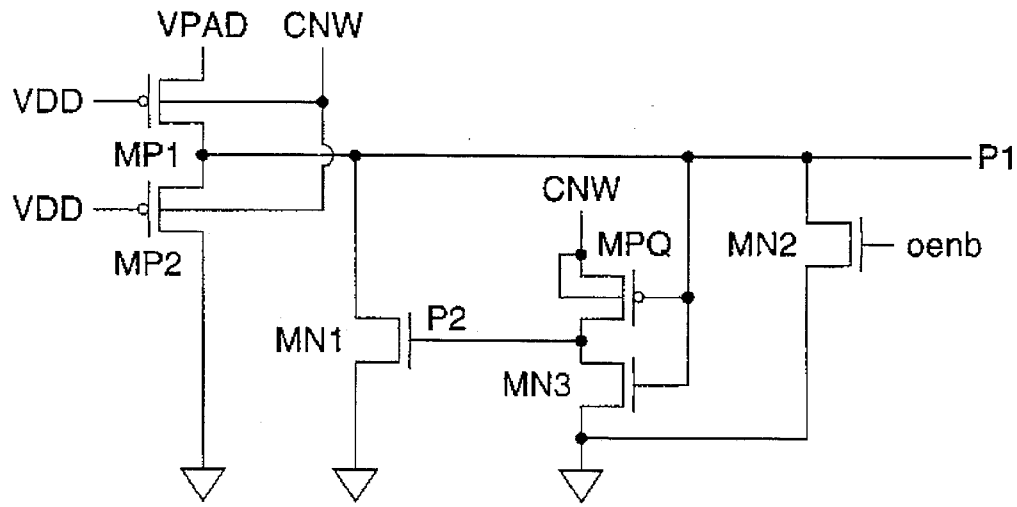

A modified version of the comparator circuit of FIG. 6A is shown in FIG. 6B. Connecting the PMOS device MPQ to CNW instead of VDD helps to pull p1 low when VPAD transitions from 5 V to VDD (i.e., 3 V). When VPAD transitions from 5 V to 3 V, PMOS device MP2 will pull P1 down to VDD +$V_{ThPMOS}$, and PMOS device MPQ will pull P2 up so long as P1 is a PMOS threshold below CNW, which would initially be at 5 V.

Referring to FIG. 2, the reason MPC is gated by P1 instead of the standard gating signal oen, is to prevent a short circuit between PU, which is preferably held at VDD (i.e., 3 V) when the circuit is in input mode, and CNW (via MPB and node 41), which will be held at 5 V when VPAD is at 5 V. When VPAD is at 5 V and VDD is 3 V, P1 is held at 5 V by the comparator circuit shown in FIGS. 5 and 6. Asserting 5 V on the gate of MPC ensures that MPC is off, thereby preventing MPC from connecting PU to CNW.

N-well control circuit

Figure 7:
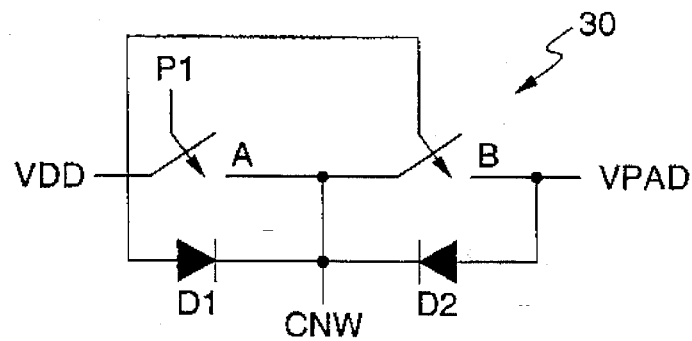
FIG. 7 depicts an N-well control circuit according to one embodiment of the invention.

FIG. 7 depicts an N-well control circuit according to one embodiment of the invention. The control N-well (CNW) signal is set to the greater of VPAD and VDD. When VPAD and VDD are equal, CNW is connected to VDD to avoid a drop in CNW below VDD. The purpose in setting CNW to a specific voltage is to prevent, as much as possible, the substrate voltage in the N-well from falling below VDD. As a result, the circuit's latch-up immunity is improved. Latch-up occurs when the drain input of a PMOS transistor becomes sufficiently greater than the N-well voltage and the gate loses control over the current in the transistor. By setting the N-well voltage to the greater of VDD and VPAD, latch-up becomes unlikely.

As shown in FIG. 7, when P1 is low, switch A is closed and CNW is set to VDD. When VPAD is greater than VDD, switch B is closed and CNW is set to VPAD. Diodes D1 and D2 are disposed between VDD and CNW and VPAD and CNW respectively to permit the greater of the voltages to directly influence CNW. This also helps reduce transient variations in the VDD and VPAD signals.

Figure 8:
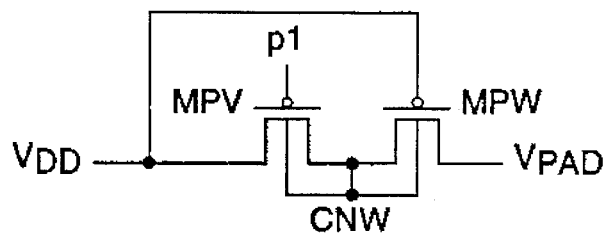
FIG. 8 depicts an N-well control circuit according to another embodiment of the invention.

FIG. 8 depicts an N-well control circuit for implementing the FIG. 7 logic diagram. When P1 is low, MPV is on, and CNW is set to VPAD. When VPAD is greater than VDD, MPW is on and CNW is set to VPAD.

Figure 9:
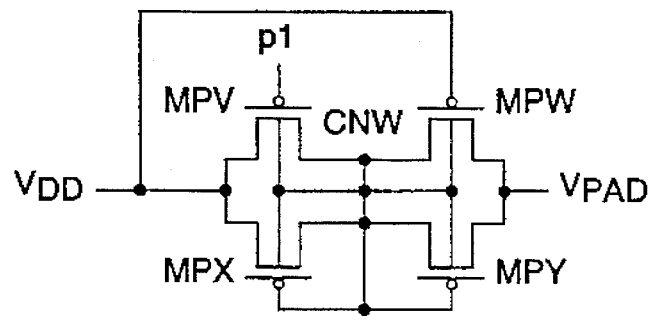
FIG. 9 depicts an N-well control circuit according to another embodiment of the invention.

FIG. 9 depicts an N-well control circuit according to another embodiment of the invention. When P1 is low, MPV is on, and CNW is set to VPAD. When VPAD is greater than VDD, MPW is on and CNW is set to VPAD. Note that whenever CNW drifts below either VDD or VPAD, MPX or MPY respectively turns on and returns CNW to the greater of VDD or VPAD.

Figure 10:
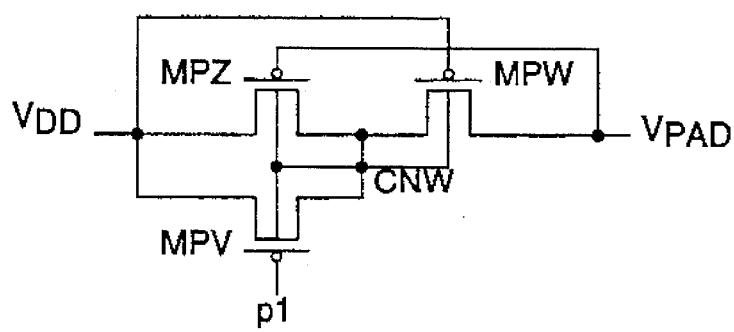
FIG. 10 depicts an N-well control circuit according to another embodiment of the invention.

FIG. 10 depicts an N-well control circuit according to another embodiment of the invention. When P1 is low, MPV is on, and CNW is set to VPAD. When VPAD is greater than VDD, MPW is on and CNW is set to VPAD. When VDD is greater than VPAD, MPZ turns on and CNW is set to VDD.

Figure 11:
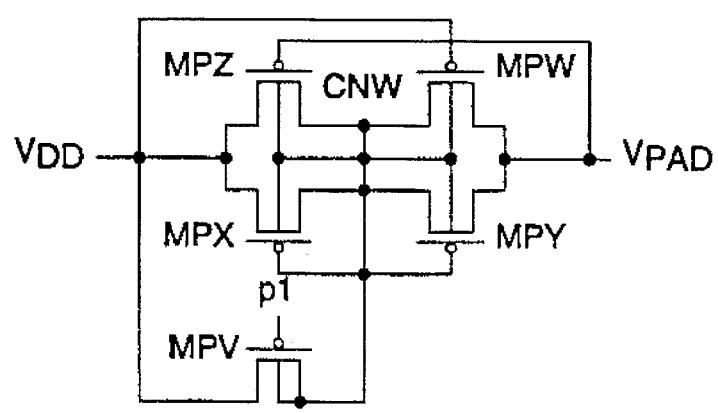
FIG. 11 depicts an N-well control circuit according to another embodiment of the invention.

FIG. 11 depicts an N-well control circuit according to another embodiment of the invention. When P1 is low, MPV is on, and CNW is set to VPAD. When VPAD is greater than VDD, MPW is on and CNW is set to VPAD. Note that whenever CNW drifts below either VDD or VPAD, MPX or MPY respectively turns on and returns CNW to the greater of VDD or VPAD. When VDD is greater than VPAD, MPZ turns on and CNW is set to VDD.

Operation of Preferred Embodiments

Figure 12:
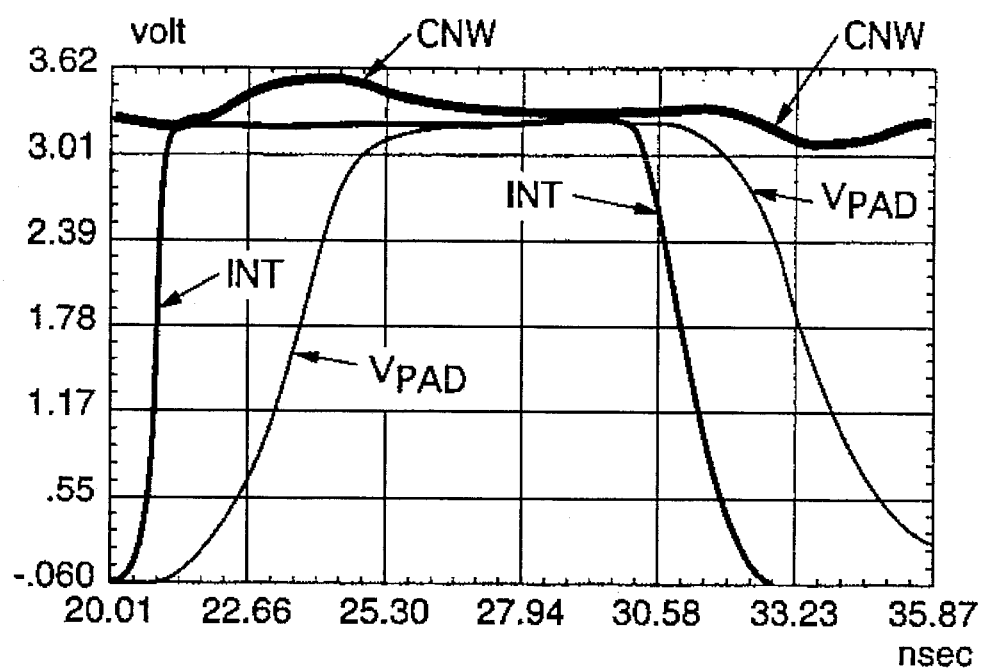
FIG. 12 depicts signal waveforms representing the operation of the circuit of FIG. 2 during output mode.

In accordance with the circuits described, the operation of the preferred embodiments is explained with reference to FIGS. 12–16, which are signal diagrams for the circuit of FIG. 2. FIG. 12 depicts output mode. Oen is low, oenb is high, CNW is VDD, and P1 is low. At 20 ns, INT begins at 0 and moves to 3 V, thereafter, VPAD follows from 0 V to 3 V. This represents transitioning from a logic 0 to a logic 1. Then, at 30 ns, INT transitions from 3 V to 0 V, and VPAD follows from 3 V to 0 V. This represents transitioning from a logic 1 to a logic 0.

Figure 13:
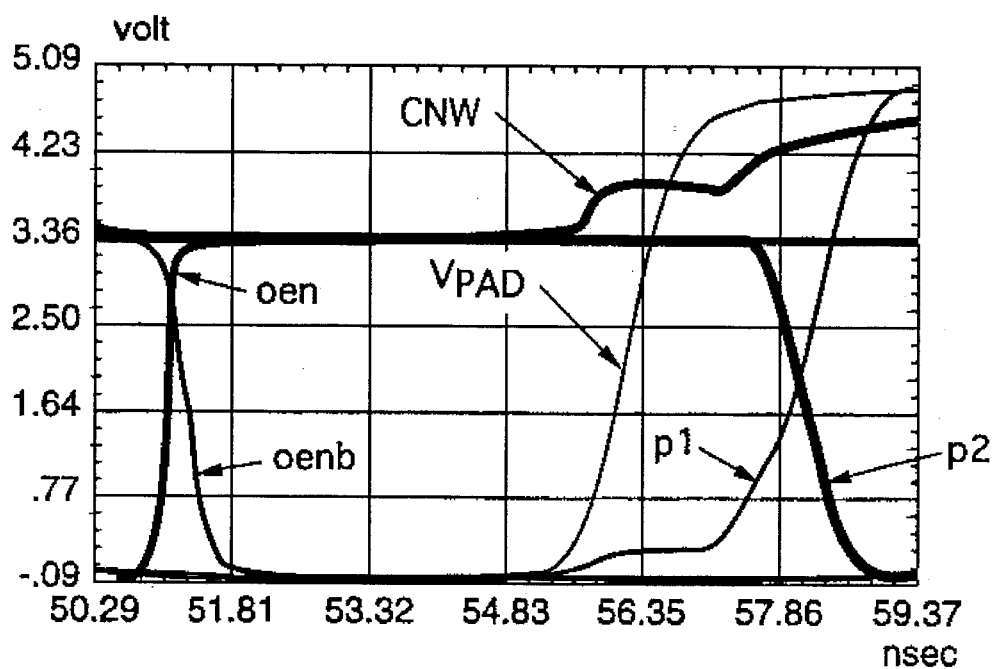
FIG. 13 depicts signal waveforms representing the operation of the circuit of FIG. 2 writing 0 V, then reading 5 V.

FIG. 13 depicts writing 0 V, then reading 5 V. Before 50 ns, during output, oen is low, oenb is high, CNW is VDD, and P1 is low. At 51 ns, oen is set high and oenb is set low in preparation for input. At 55 ns, VPAD is driven up by the external input signal. CNW follows up to approximately the VPAD signal, P1 rises to the VPAD signal, and P2 (inverse of P1) falls to zero.

Figure 14:
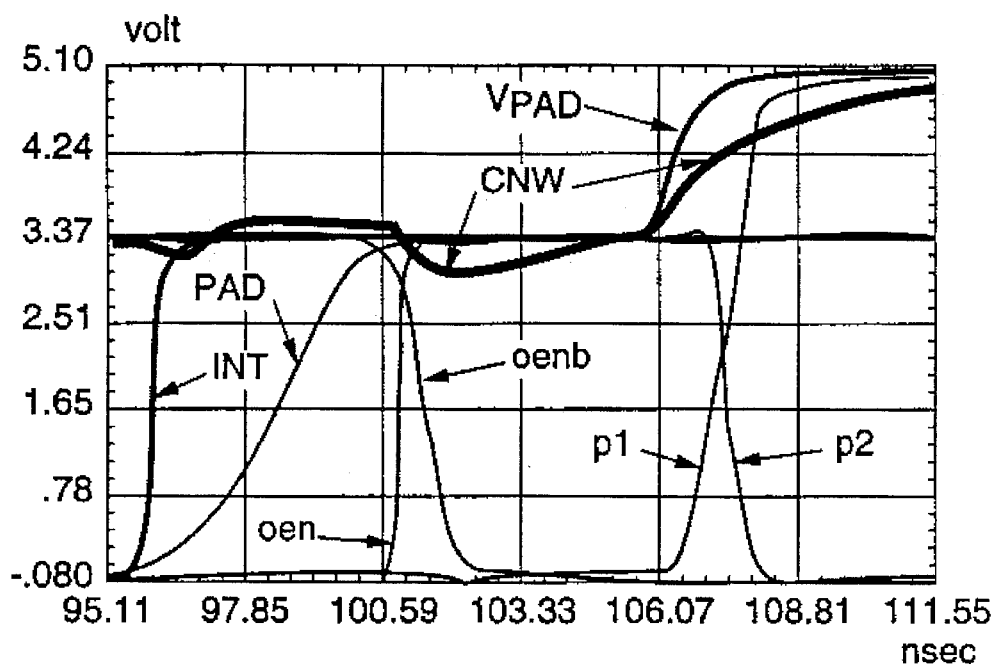
FIG. 14 depicts signal waveforms representing the operation of the circuit of FIG. 2 writing 0 V, then writing 3 V, then reading 5 V.

FIG. 14 depicts the circuit of FIG. 2 writing 0 V, then writing 3 V, then reading 5 V. Before 95 ns, during output, oen is low, oenb is high, CNW is VDD, and P1 is low. Before 95 ns, INT is at logic 0. At 95 ns, INT begins at 0 V and transitions to 3 V, thereafter, VPAD follows from 0 V to 3 V. This represents transitioning from a logic 0 to a logic 1. At 100 ns, oen is set high and oenb is set low in preparation for input. At 106 ns, VPAD is driven up by the external input signal. CNW follows up to approximately the VPAD signal, P1 rises to the VPAD signal, and P2 falls to zero.

Figure 15:
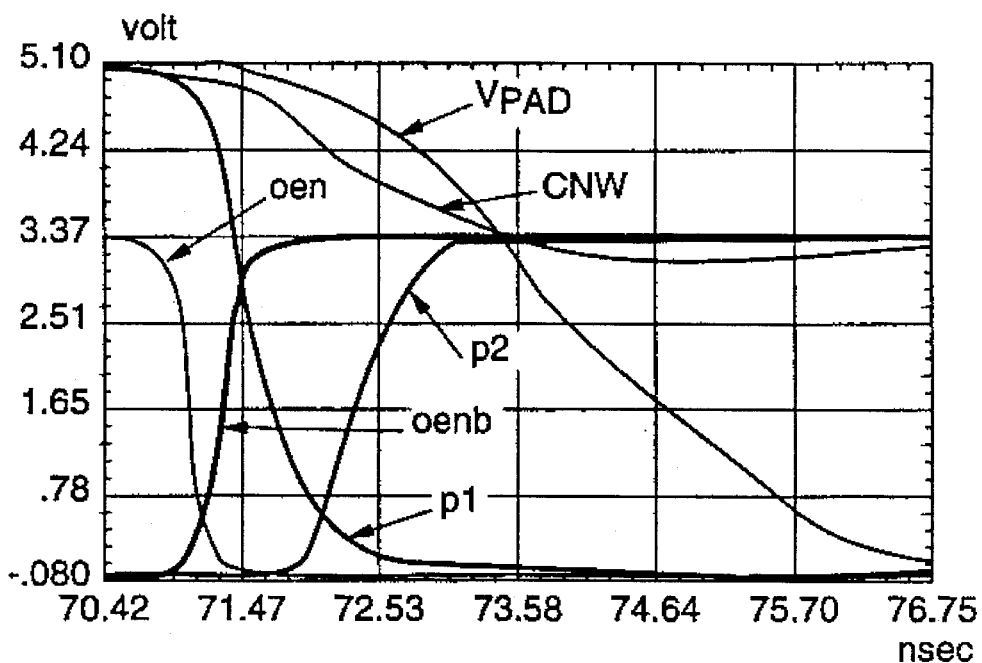
FIG. 15 depicts signal waveforms representing the operation of the circuit of FIG. 2 reading 5 V, then writing 0 V.

FIG. 15 depicts the circuit of FIG. 2 reading 5 V, then writing 0 V. Before 70 ns, during input, oen is high, oenb is low, VPAD is driven high by the external input signal, CNW is VPAD, and P1 is VPAD. At 71 ns, in preparation for an output signal, oen is set low and oenb is set high. P1 follows to low and P2 transitions to high. CNW follows VPAD from the high input signal to VDD and remains at VDD. INT remains at 0 V throughout the relevant time period, and VPAD transitions to 0 V representing a logic 0.

Figure 16:
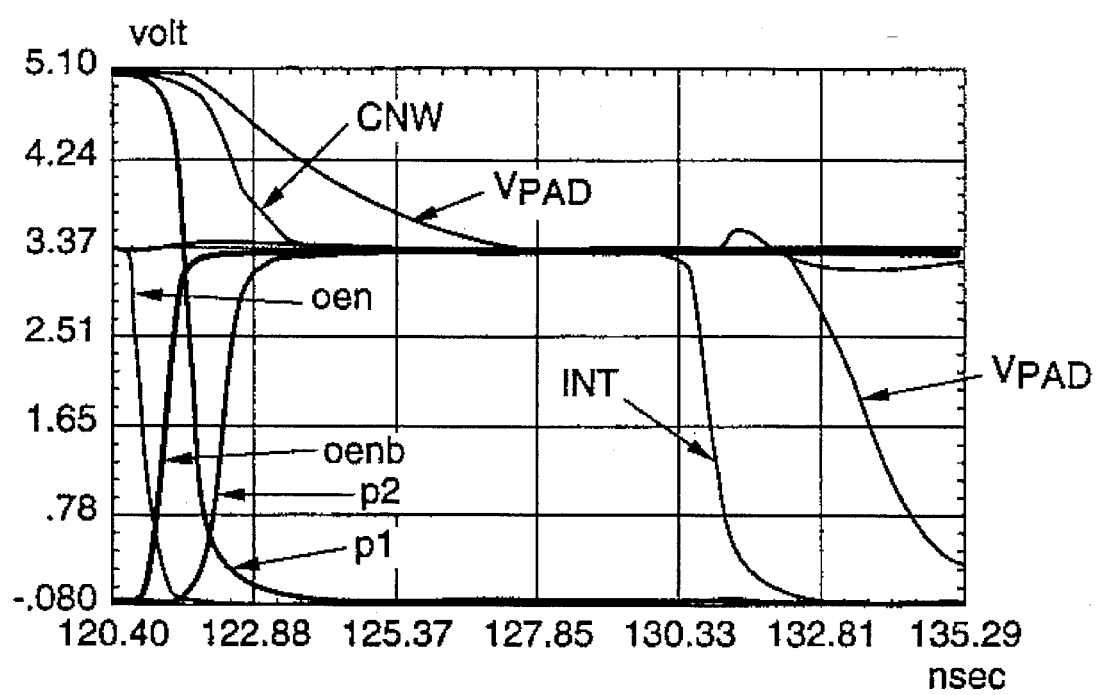
FIG. 16 depicts signal waveforms representing the operation of the circuit of FIG. 2 reading 5 V, then writing 3 V, then writing 0 V.

FIG. 16 depicts the circuit of FIG. 2 reading 5 V, then writing 3 V, then writing 0 v. Before 120 ns, during input, oen is high, oenb is low, VPAD is driven high by the external input signal, CNW is VPAD, and P1 is VPAD. At 121 ns, in preparation for an output signal, oen is set low and oenb is set high, P1 follows to low and P2 transitions to high. CNW follows VPAD from the high input signal to VDD and remains at VDD. INT is at 3 V, which is where VPAD settles at 125 ns representing a logic 1. At 130 ns, INT transitions from 3 V to 0 V, and VPAD follows to 0 representing a logic 0.

Having disclosed exemplary embodiments and the best mode, modifications and variations may be made to the disclosed embodiments while remaining within the scope of the present invention as defined by the following claims.

What is claimed is:

1. An input/output circuit having a power supply terminal, a ground terminal and an output enable terminal, for communicating an internal output signal to an external output terminal and for communicating an external input signal to an internal input terminal, said input/output circuit comprising:

a conductor coupled to said external terminal and to said internal terminal;

a pull-up circuit coupled to said power supply terminal and to said conductor and including a PMOS transistor having an N-well, said pull-up circuit configured to selectively pull-up said output signal;

a pull-down circuit coupled to said ground terminal and to said conductor and configured to selectively pull,down said output signal;

a comparison and logic control circuit coupled to said power supply terminal and to said conductor and configured to compare a supply voltage level to said input signal and configured to generate an affirmative logic signal when said input signal is greater than said supply voltage level and to generate a negative logic signal when said input signal is less than a supply voltage level; and an N -well control circuit coupled to said power supply terminal, to said conductor and to said pull-up circuit, responsive to said logic signal, and configured to output a control N-well signal to control said PMOS transistor N-well;

wherein:
said pull-up circuit is further coupled to said output enable terminal and is responsive to an output enable signal such that when said output enable signal is affirmative, said pull-up circuit is enabled and is responsive to an internal output signal;
said pull-down circuit is further coupled to said output enable terminal and is responsive to said output enable signal such that when said output enable signal is affirmative, said pull-down circuit is enabled and is responsive to said internal output signal;

said comparison and logic control circuit is further coupled to said output enable terminal and is responsive to said output enable signal such that when said output enable signal is affirmative, said comparison and logic control circuit is disabled; and said N-well control circuit is further coupled to said output enable terminal and is responsive to said output enable signal such that when said output enable signal is affirmative, said control N-well signal is set to supply voltage level.

2. The input/output circuit of claim 1 further having an output enable terminal, wherein:

said pull-up circuit is further coupled to said output enable terminal and is responsive to an output enable signal such that when said output enable signal is negative, said pull-up circuit is disabled;

said pull-down circuit is further coupled to said output enable terminal and is responsive to said output enable signal such that when said output enable signal is negative, said pull-down circuit is disabled;

said comparison and logic control circuit is further coupled to said output enable terminal and is responsive to said output enable signal such that when said output enable signal is negative, said comparison and logic control circuit is enabled; and said N-well control circuit is further coupled to said output enable terminal and is responsive to said output enable signal such that when said output enable signal is negative, said control N-well signal is set to the greater of said supply voltage level and said input signal.

3. An input/output circuit having a power supply terminal, a ground terminal and an output enable terminal, for communicating an internal output signal to an external output terminal and for communicating an external input signal to an internal input terminal, said input/output circuit comprising:

a conductor coupled to said external terminal and to said internal terminal;

a pull-up circuit coupled to said power supply terminal and to said conductor and including a PMOS transistor having an N-well, said pull-up circuit configured to selectively pull-up said output signal;

a pull-down circuit coupled to said ground terminal and to said conductor and configured to selectively pull-down said output signal;

a comparison and logic control circuit coupled to said power supply terminal and to said conductor and configured to compare a supply voltage level to said input signal and configured to generate an affirmative logic signal when said input signal is greater than said supply voltage level and to generate a negative logic signal when said input signal is less than a supply voltage level; and an N-well control circuit coupled to said power supply terminal, to said conductor and to said pull-up circuit, responsive to said logic signal, and configured to output a control N-well signal to control said PMOS transistor N-well;

wherein:

said pull-up circuit is further coupled to said output enable terminal and is responsive to an output enable signal such that when said output enable signal is negative, said pull-up circuit is disabled;

said pull-down circuit is further coupled to said output enable terminal and is responsive to said output enable signal such that when said output enable signal is negative, said pull-down circuit is disabled;

said comparison and logic control circuit is further coupled to said output enable terminal and is responsive to said output enable signal such that when said output enable signal is negative, said comparison and logic control circuit is enabled; and said N-well control circuit is further coupled to said output enable terminal and is responsive to said output enable signal such that when said output enable signal is negative, said control N-well signal is set to the greater of said supply voltage level and said input signal.

4. A method of communicating a high voltage input signal from an external terminal to an internal terminal using an input/output circuit having a power supply terminal, a pull-up circuit including a PMOS transistor, a pull-down circuit, and a comparison circuit, said method comprising the steps of:

receiving the input signal at a the external terminal;

sensing the input signal in the comparison circuit;

comparing said input signal to a supply voltage at the power supply terminal;

when said input signal is greater than said supply voltage, setting a PMOS transistor N-well voltage in the pull-up circuit to that of the input signal;

when said input signal is less than said supply voltage, setting the PMOS transistor N-well voltage in said pull-up circuit to that of a supply signal;

coupling said pull-up circuit and pull down circuit to an output enable terminal for receiving an output enable signal; and when said output enable signal is affirmative, enabling said pull-up circuit and said pull-down circuit to respond to an internal output signal, disabling performance of said comparing step, and setting the PMOS transistor N-well voltage in said pull-up circuit to that of said supply signal.

5. The method of claim 4, including:

when said output enable signal is negative, disabling said pull-down circuit, enabling said comparison circuit to perform said comparing step, and setting the PMOS transistor N-well voltage to the greater of said supply voltage level and said input signal.

6. A method of communicating a high voltage input signal from an external terminal to an internal terminal using an input/output circuit having a power supply terminal, a pull-up circuit including a PMOS transistor, a pull-down circuit, and a comparison circuit, said method comprising the steps of:

receiving the input signal at a the external terminal;

sensing the input signal in the comparison circuit;

comparing said input signal to a supply voltage at the power supply terminal;

when said input signal is greater than said supply voltage, setting a PMOS transistor N-well voltage in the pull-up circuit to that of the input signal;

when said input signal is less than said supply voltage, setting the PMOS transistor N-well voltage in said pull-up circuit to that of a supply signal;

coupling said pull-up circuit and pull down circuit to an output enable terminal for receiving an output enable signal; and when said output enable signal is negative, disabling said pull-up circuit, disabling said pull-down circuit, enabling said comparison circuit to perform said comparing step, and setting the PMOS transistor N-well voltage to the greater of said supply voltage level and said input signal.

* * * * *